US010236400B2

(12) United States Patent
Furrer et al.

(10) Patent No.: US 10,236,400 B2
(45) Date of Patent: Mar. 19, 2019

(54) QUANTUM DOT FILM BASED DEMODULATION STRUCTURES

(71) Applicant: Heptagon Micro Optics Pte. Ltd., Singapore (SG)

(72) Inventors: Daniel Furrer, Uetikon am See (CH); Stephan Beer, Schaffhausen (CH); Bernhard Buettgen, Adliswil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 220 days.

(21) Appl. No.: 15/419,273

(22) Filed: Jan. 30, 2017

(65) Prior Publication Data

US 2017/0222076 A1    Aug. 3, 2017

Related U.S. Application Data

(60) Provisional application No. 62/300,294, filed on Feb. 26, 2016, provisional application No. 62/289,726, filed on Feb. 1, 2016.

(51) Int. Cl.
| | |
|---|---|
| *H01L 31/00* | (2006.01) |
| *H01L 31/0352* | (2006.01) |
| *H01L 27/144* | (2006.01) |
| *H01L 31/0224* | (2006.01) |
| *H01L 31/16* | (2006.01) |
| *G01S 7/481* | (2006.01) |
| *G01S 17/36* | (2006.01) |
| *G01S 17/89* | (2006.01) |
| *G01S 7/491* | (2006.01) |

(52) U.S. Cl.
CPC .... *H01L 31/035218* (2013.01); *G01S 7/4816* (2013.01); *G01S 7/4914* (2013.01); *G01S 7/4915* (2013.01); *G01S 17/36* (2013.01); *G01S 17/89* (2013.01); *H01L 27/1443* (2013.01); *H01L 27/1446* (2013.01); *H01L 31/022408* (2013.01); *H01L 31/165* (2013.01)

(58) Field of Classification Search
CPC ......... H01L 31/035218; H01L 27/1446; H01L 31/022408; H01L 27/1443; H01L 31/165; G01S 7/4915; G01S 7/4914; G01S 17/89; G01S 17/36; G01S 7/4816
USPC ........................ 250/214.1, 214 R; 257/13, 21
See application file for complete search history.

(56) References Cited

U.S. PATENT DOCUMENTS

| | | |
|---|---|---|
| 6,051,447 A | 4/2000 | Lee et al. |
| 6,329,668 B1 | 12/2001 | Razeghi |
| 7,098,067 B2 | 8/2006 | Adkisson et al. |

(Continued)

FOREIGN PATENT DOCUMENTS

| | | |
|---|---|---|
| CN | 101740655 | 6/2010 |
| CN | 102237202 | 11/2011 |

(Continued)

OTHER PUBLICATIONS

Arango, A quantum Dot Heterojunction Photodetector:, *Massachusetts Institute of Technology* (2005), pp. 1-117.

(Continued)

*Primary Examiner* — Seung C Sohn
(74) *Attorney, Agent, or Firm* — Fish & Richardson P.C.

(57) ABSTRACT

The present disclosure describes quantum dot film based demodulation structures and optical ranging systems including an array of QDF demodulation structures.

22 Claims, 15 Drawing Sheets

(56) References Cited

U.S. PATENT DOCUMENTS

| | | |
|---|---|---|
| 7,141,836 B1 | 11/2006 | Adkisson et al. |
| 8,076,740 B2 | 12/2011 | Uchiyama et al. |
| 8,610,232 B2 * | 12/2013 | Coe-Sullivan ........ G01J 3/2803 |
| | | 257/448 |
| 8,658,889 B2 | 2/2014 | Huang |
| 8,729,528 B2 | 5/2014 | Klem et al. |
| 8,994,005 B2 | 3/2015 | Mitin et al. |
| 9,349,970 B2 * | 5/2016 | Klem ................. H01L 51/4213 |
| 2006/0138396 A1 | 6/2006 | Lin et al. |
| 2007/0228358 A1 | 10/2007 | Ofek |
| 2011/0146766 A1 | 6/2011 | Nozik et al. |
| 2011/0203650 A1 | 8/2011 | Furusawa |
| 2014/0225063 A1 | 8/2014 | Klem et al. |
| 2014/0231879 A1 | 8/2014 | Meynants et al. |
| 2014/0261650 A1 | 9/2014 | Kim et al. |

FOREIGN PATENT DOCUMENTS

| | | |
|---|---|---|
| CN | 102637754 | 8/2012 |
| CN | 202633358 | 12/2012 |
| CN | 103618047 | 3/2014 |
| EP | 2442325 | 4/2012 |
| JP | 2008-251989 | 10/2008 |
| JP | 2013-122972 | 6/2013 |
| JP | 5255042 | 8/2013 |
| JP | 5302270 | 10/2013 |
| JP | 2014-143224 | 8/2014 |
| KR | 20070113608 | 11/2007 |
| KR | 20090103114 | 10/2009 |
| KR | 20120012719 | 2/2012 |
| KR | 20120128543 | 11/2012 |
| KR | 20130045506 | 5/2013 |
| KR | 20140087383 | 7/2014 |
| KR | 20140112654 | 9/2014 |
| KR | 101500669 | 3/2015 |
| KR | 101558801 | 10/2015 |
| WO | 2007/139256 | 12/2007 |
| WO | 2007/139257 | 12/2007 |
| WO | 2014/185587 | 11/2014 |

OTHER PUBLICATIONS

Chang et al., "Low-Temperature Solution-Processed Solar Cells Based on PbS Colloidal Quantum Dot/Cds Heterojunctions", *American Chemical Society, Nano Lett.* (2013) 13:994-999.

Liu et al., "Dependence of Carrier Mobility on Nanocrystal Size and Ligand Length in PbSe Nanocrystal Solids", *American Chemical Society, Nano Lett.* (2010) 10:1960-1969.

Sandeep et al., "High charge-carrier mobility enables exploitation of carrier multiplication in quantum-dot films", *Nature Communications*, (2013), DOI:10.1038/ncomms3360, pp. 1-6.

Wu et al., "Flexible Thin-Film Nanocrystal Quantum Dot Photodetectors on Unmodified Transparency Films", *IEEE* (2012) DOI:10.1109/IPCon.2012.6358651, pp. 380-381.

* cited by examiner

US 10,236,400 B2

QUANTUM DOT FILM BASED DEMODULATION STRUCTURES

CROSS-REFERENCE TO RELATED APPLICATION(S)

This application claims the benefit of priority U.S. Application No. 62/289,726, filed on Feb. 1, 2016 and U.S. Application No. 62/300,294, filed on Feb. 26, 2016. The disclosure of the prior applications is incorporated herein by reference.

FIELD OF THE DISCLOSURE

The present disclosure relates to quantum dot film based demodulation structures.

BACKGROUND

Optical ranging systems can include an illumination module and an array of 3D pixels. For example, an optical ranging system can be implemented as a time-of-flight-based system. Accordingly, an illumination module in such a system can be operable to generate modulated light. The modulated light can be incident on a scene including one or more objects. Some of the modulated light directed onto the object or objects can be reflected back to an array of demodulation pixels. In such instances, a comparison of the phase of the light first generated by (emitted from) the illumination module and the phase of the light reflected back from an object to the array of demodulation pixels can be used to determine the distance to the object.

SUMMARY

Time of flight (TOF) pixels and other demodulation structures that include quantum dot film (QDF) elements are described. In some implementations, the demodulation structures facilitate detection of long wavelength photons with relatively high efficiency (i.e., better than silicon). Further, in some cases, the structures can facilitate charge transport at relatively high speeds (e.g., 1 ns).

In general, the structures can be implemented as one or more QDF photo detection elements on a CMOS semiconductor wafer. The QDF functions to convert photons into photo-generated charge (electrons and holes). The demodulation area, including high-speed switches, and charge storage regions, as well as read-out and reset circuitry, can be implemented in the CMOS wafer. The QDF can be embedded between top and bottom transparent metal contacts (e.g., ITO) that serve as electrodes. The electrodes provide electrical contact between the QDF and the CMOS wafer, and also create an electric field within the QDF to separate the photo-generated electrons and holes when a voltage is applied across the QDF. In some implementations, providing a 1-3 voltage across the QDF can result in a high speed (>1 ns) charge transport.

The disclosure also describes optical ranging systems that include an illumination module and an array of QDF demodulation structures. The illumination module is operable to generate modulated light to be incident on a scene including one or more objects such that some of the modulated light incident on the one or more objects is reflected back to the array of QDF demodulation structures.

The disclosure also describes a pinned photodiode structure that can be used, for example, in combination with a QFD photo detection element.

Other aspects, features and advantages will be readily apparent from the following detailed description, the accompanying drawings, and the claims.

DETAILED DESCRIPTION

Figure 1:
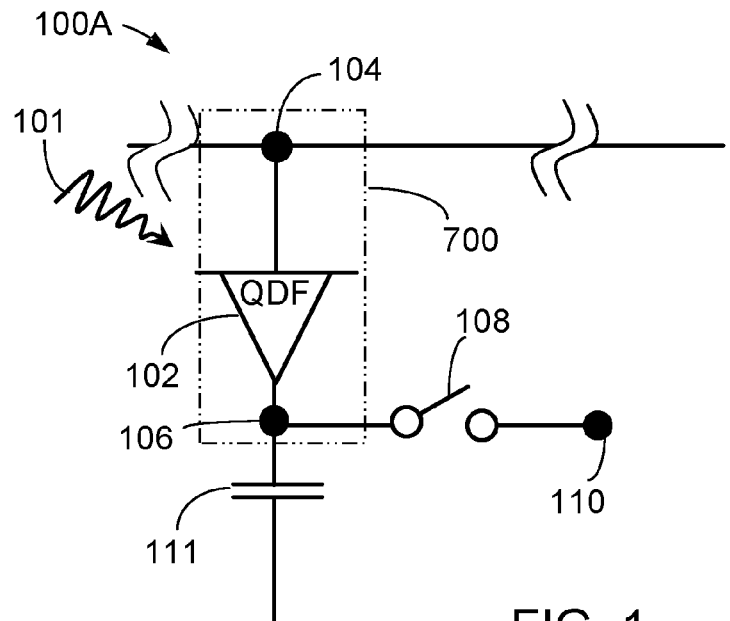
FIG. 1 illustrates an example of a QDF-based demodulation structure.

FIG. 1 illustrates an example of a demodulation pixel 100A that includes a QDF 102 having a top electrode 104 and a bottom electrode 106. The QDF 102 serves as a photo detecting element. The bottom electrode 106 is connected to a capacitor (implemented, e.g., as a MIM transistor) 111 as well as a reset switch 108 and serves as a charge collection node. In some implementations, the top electrode 104 is set to a specified voltage (e.g., 5 V) and the bottom side of the capacitor 111 is modulated with an external drive signal (e.g., 0-5 V). Applying the modulation signal modulates the node 106, thereby activating and deactivating the QDF 102. The modulation frequency can depend on the implementation; frequencies of 1 MHz or higher can be used to enable high-speed operation. In some cases, modulation frequencies (and switching frequencies) of hundreds of MHZ can be used. Photo charge generated by the QDF 102 is stored by the capacitor 111. Readout circuitry can be coupled to node 110. Such readout circuitry can include, for example, a source follower, a select transistor and an off-pixel columnwise current source. Multiple pixels can be arranged in an array having row and column select circuitry for readout.

Figure 2:
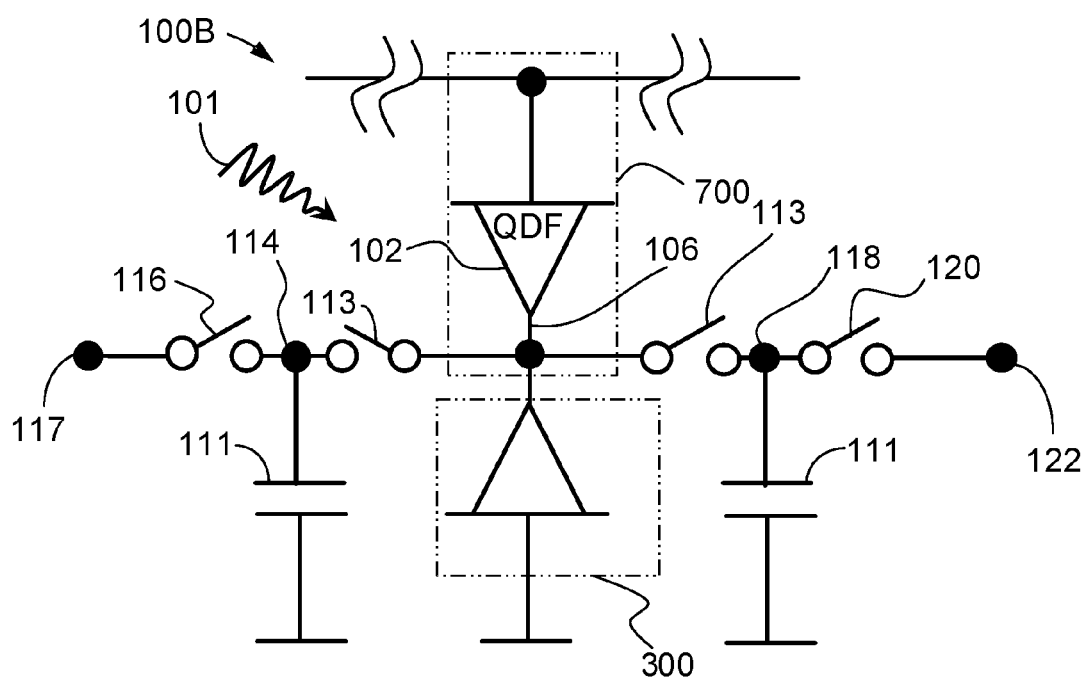
FIG. 2 illustrates another example of a QDF-based demodulation structure using a pinned photodiode.

FIG. 2 illustrates another example that includes a pinned photodiode (PPD) 300 that creates a fixed potential well to which photo generated charges are fed from the QDF 102 via the QDF's bottom electrode 106. Switching is performed with respect to the charges stored by the PPD 300. In particular, the charges are transferred, alternately, to one of two (or more) storage nodes 114, 118 associated with respective capacitors 111 by applying a modulation signal to close/open first high-speed switches 113. The circuitry includes reset switches 116, 120. Readout circuitry can be coupled to nodes 117, 122. Although FIG. 1B shows two storage nodes 114, 118 and associated storage capacitors 111, other implementations can include more than two storage nodes and associated storage capacitors so as to provide an n-tap structure (i.e., n≥3).

Figure 3C:
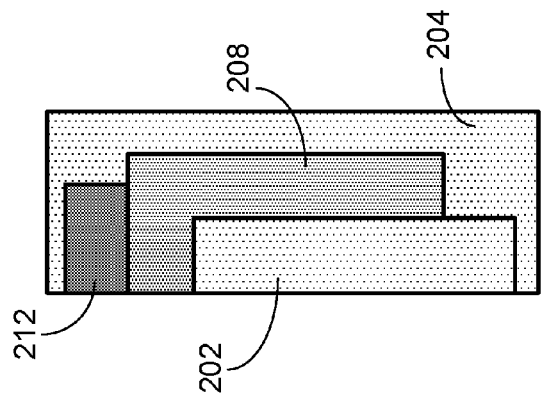
FIGS. 3A, 3B and 3C illustrate a structure for a pinned photodiode.
Figure 3A:
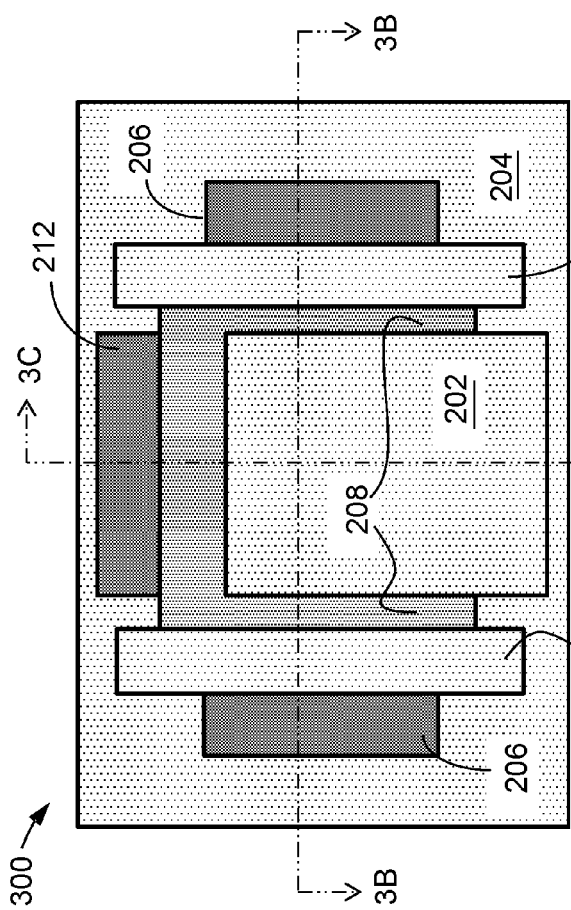
Figure 3B:
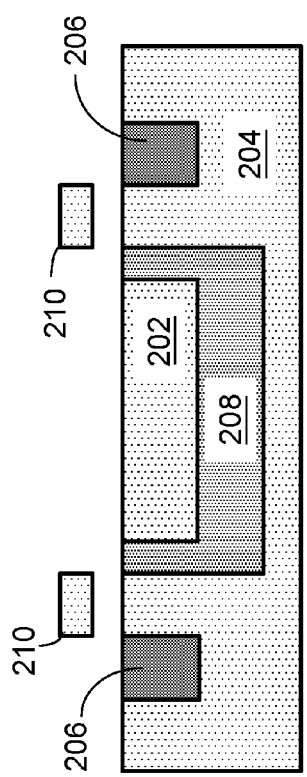

FIGS. 3A, 3B and 3C illustrate an example of a structure for the PPD 300, which can be used for charge transfer and which provides connection to the QDF. In this example, a semiconductor region 202 having a first-type dopant (e.g., P+ doped) is disposed over a region 208 having second-type dopant (e.g., N− doped) opposite that of the first-type dopant. Storage nodes 206 of the second-type dopant (e.g., N+) also are provided in the bulk polysilicon 204. Polysilicon gates 210 correspond to the switches 113 in FIG. 2. An additional node 212 of the second-type dopant (e.g., N+) in the bulk polysilicon 204 below the region 208 provides direct electrical connection to the bottom electrode 106 of the QDF 102 (see FIG. 2).

As shown in the illustrated example of FIGS. 3A-3C, the N− doped region 208 can extend laterally, along a first axis, beyond the boundary of the P+ region 202 toward the N+ storage nodes 206. The N− doped region 208 also can extend laterally somewhat, along a second axis perpendicular to the first axis, beyond the boundary of the P+ region 202. As further shown in the example of FIGS. 3A-3C, the node 212 can extend laterally, along the second axis, beyond the boundary of the N region 208. In other implementations, the N and P doped regions can be reversed for the PPD structure of FIGS. 3A-3C.

In some implementations, the PPD 300 includes a drift field and/or a dump gate. The dump gate can be useful so that photo charge generated during a readout period is not collected. In some cases, a MOS gate can be used instead of the PPD 300.

Figure 4:
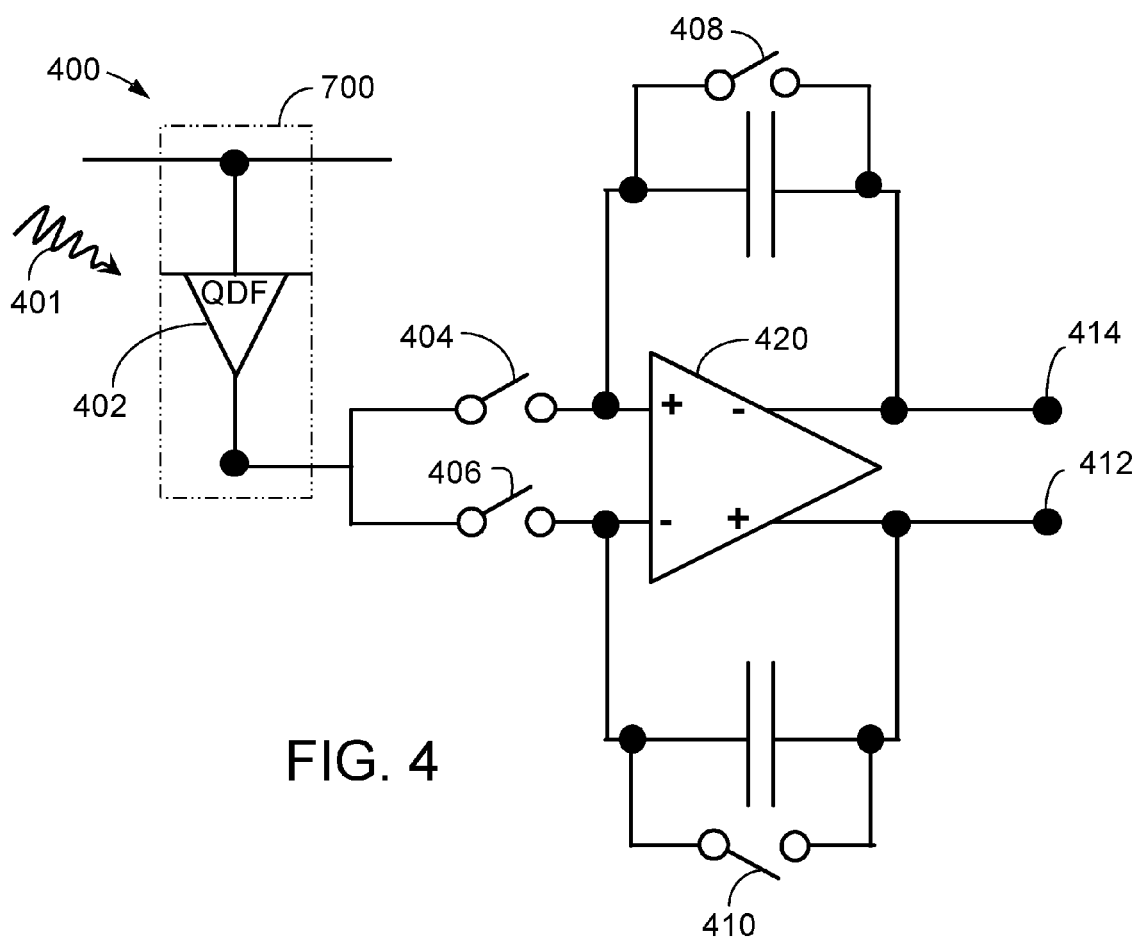
FIG. 4 illustrates an example of a 2-tap QDF-based demodulation structure using a charge amplifier.

One issue that can arise in the implementation of FIG. 1 is that as node 106 is driven, it accumulates charge, thereby causing the potential across the QDF to vary. FIG. 4 illustrates an example that can help hold the potential at the bottom electrode of the QDF substantially constant. As shown in FIG. 4, the bottom electrode of the QDF 402 is connected, by way of switches 404, 406, to positive (+) and negative (−) terminals of an charge amplifier 420. The input terminals of the charge amplifier 420 are held at the same potential, and modulation signals are applied to the switches 404, 406 such that when one switch is open, the other switch is closed. Charges are accumulated and stored by the respective capacitors depending on which switch 404, 406 is closed. Differential output of the two samples (2-tap) are provided at nodes 412, 414. Reset switches are indicated by 408, 410. The pixel is reset by closing both switches 408, 410.

Figure 5:
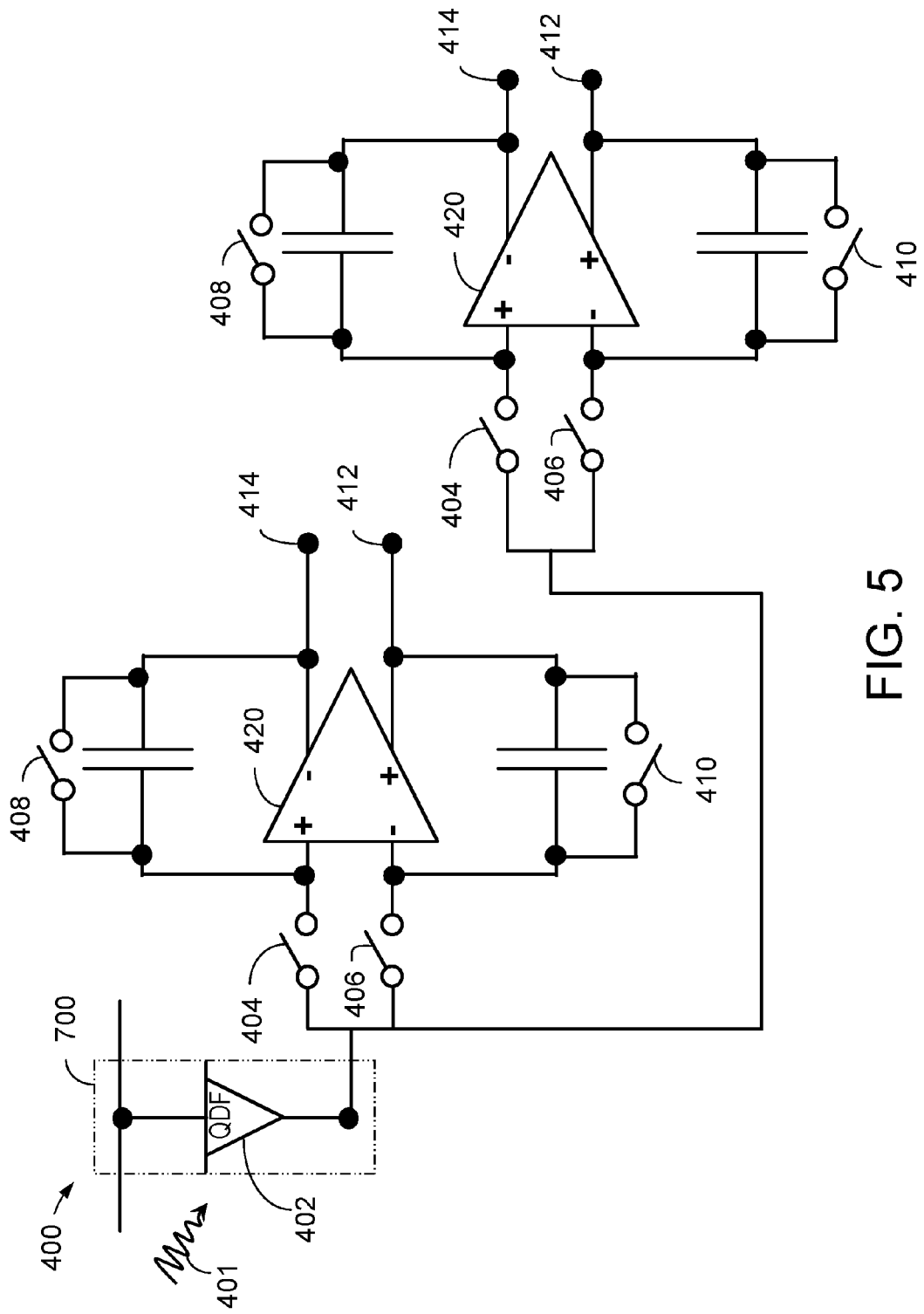
FIG. 5 illustrates an example of a 4-tap QDF-based demodulation structure using charge amplifiers.

The structure of FIG. 4 can be expanded to provided, for example, a 4-tap pixel by adding a second charge amplifier 420 and associated circuitry as shown in FIG. 5. The signal from the QDF photo detector 402 is demodulated by 0 and 90 degrees, respectively, such that two times the charge amplifiers are provided in one pixel. Thus, one pixel has two differential outputs.

Figure 6:
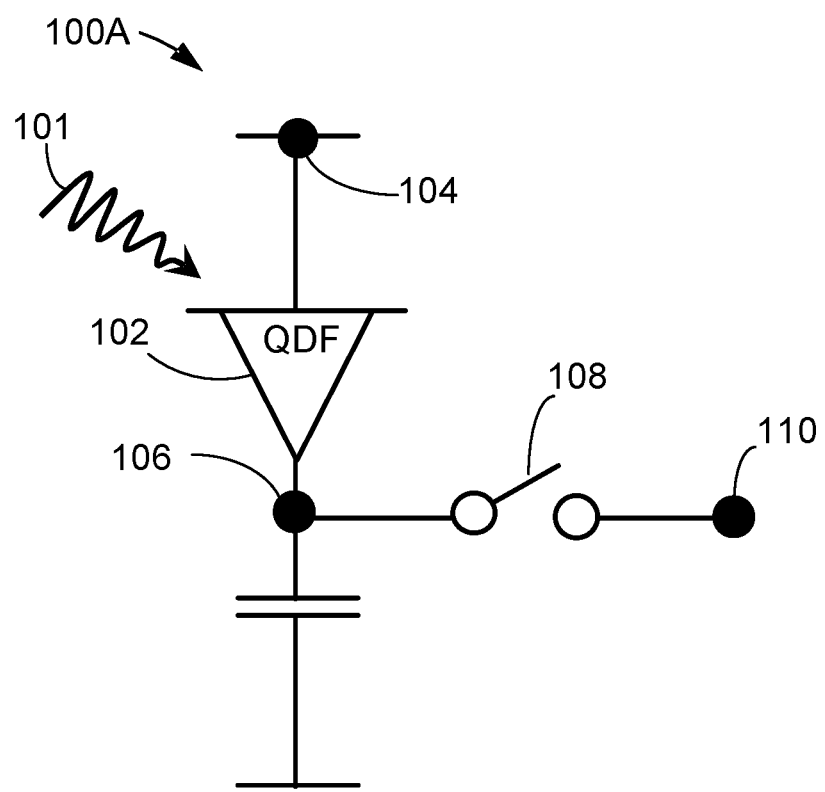
FIG. 6 illustrates an example of a QDF-based demodulation structure for detecting and sampling photo generated electrons and holes.

FIG. 6 illustrates an example in which the both photo generated electrons and holes can be detected and sampled. This structure allows information to be acquired at close to 100% of the time, rather than only 50% of the time (e.g., as in the structure of FIG. 1A where the QDF is activated only 50 of the time). For example, the modulation signal can be applied to the top electrode 104 and is toggled between Vlow and the voltage (V106) at node 106, where Vlow<V106. Such operation results in 1-tap pixel operation in which only electrons are collected. Instead, however, the modulation signal can be toggled between Vlow and Vhigh, where Vlow<V106 and where Vhigh>V106. Such operation results in differential pixel operation in which the signal on the capacitor represents the difference between two samples that are separated by 180 degrees (assuming the duty cycle of the modulation signal is 50%). Collection of electrons and holes on the capacitor leads to charge-domain subtraction of unmodulated light (e.g., background light or ambient light). If the potential on the top and bottom electrodes 104, 106 is the same, then the QDF is in an inactive state.

Figure 7:
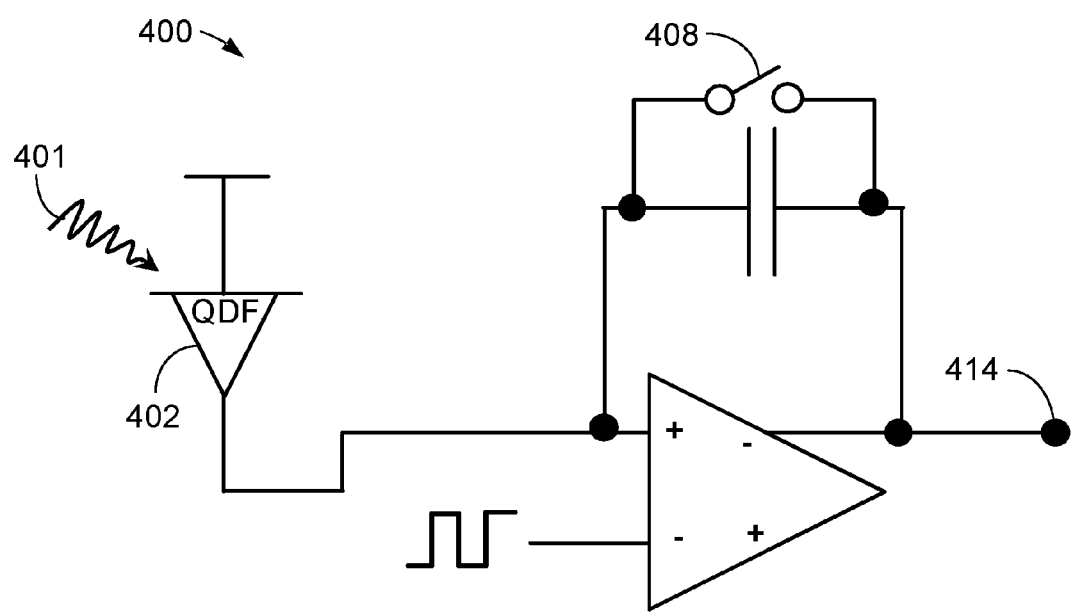
FIG. 7 illustrates an example of a QDF-based demodulation structure using a single ended charge amplifier.
Figure 8:
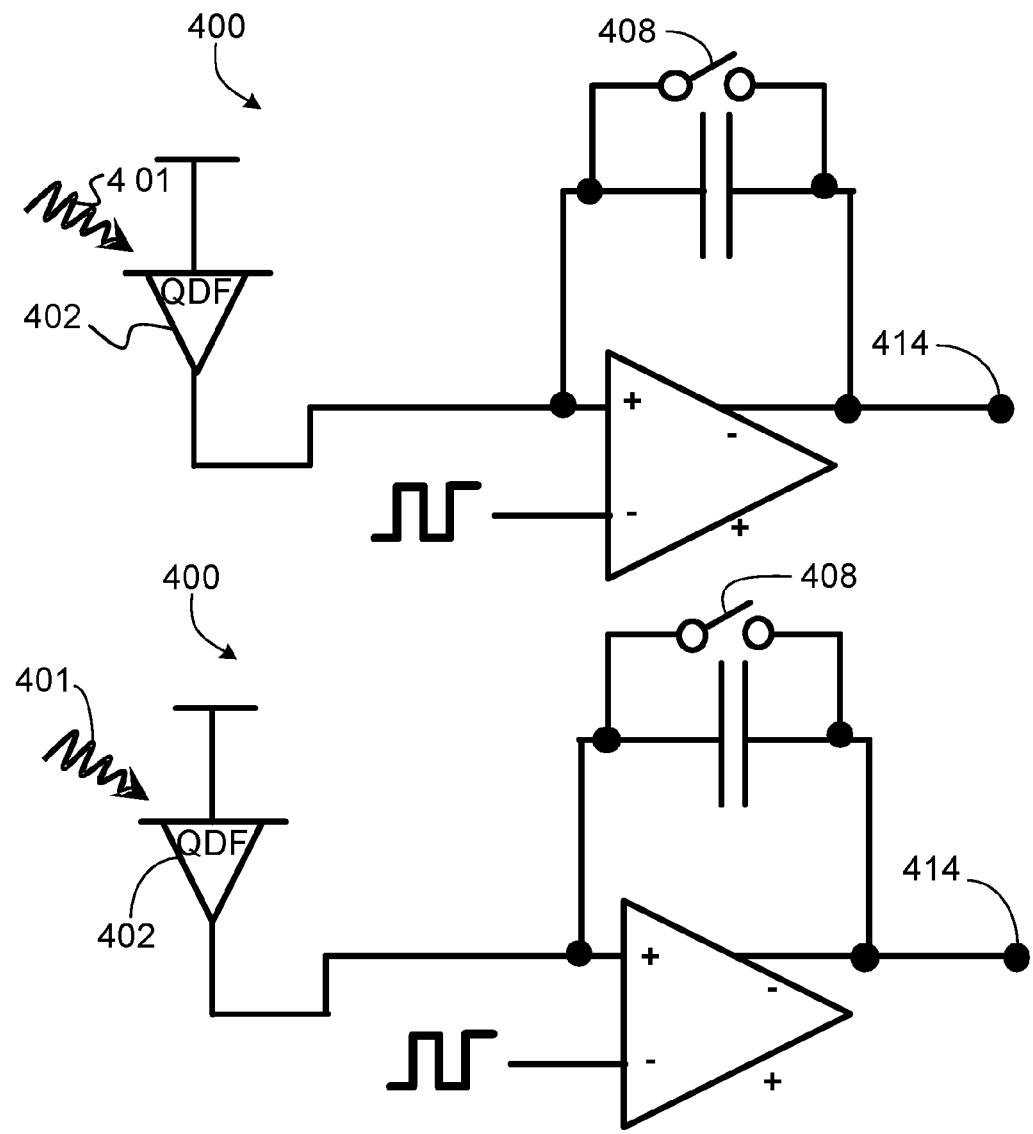
FIG. 8 illustrates an example of a 4-tap QDF-based demodulation structure.

FIGS. 7 and 8 illustrate examples of single ended charge amplifiers. In particular, the 2-tap structure of FIG. 7 delivers a sample that represents the difference between the electron and hole photocurrents. The bottom electrode of the QDF 402 is coupled to the positive (+) terminal of the charge amplifier, and thus the potential of the bottom electrode is well controlled (i.e., is relatively stable). The modulation signal is applied to the negative terminal (−) of the charge amplifier. The modulation signal toggles between two voltages: a lower level that is below the QDF top electrode voltage, and a higher level that is greater than QDF top electrode voltage. This structure can provide inherent background suppression by collecting both electrons and holes. The amplifier should support high speed of the modulation signal.

The structure of FIG. 7 can be expanded, as shown in FIG. 8, to provide a 4-tap implementation. In this case, two QDF detectors 402 are disposed in close proximity to each other so that the QE modulation becomes effective. The pixel has two QDF photo detectors and two charge amplifiers. One section receives 0-degree modulation, whereas the other section receives 180-degree modulation.

Figure 9:
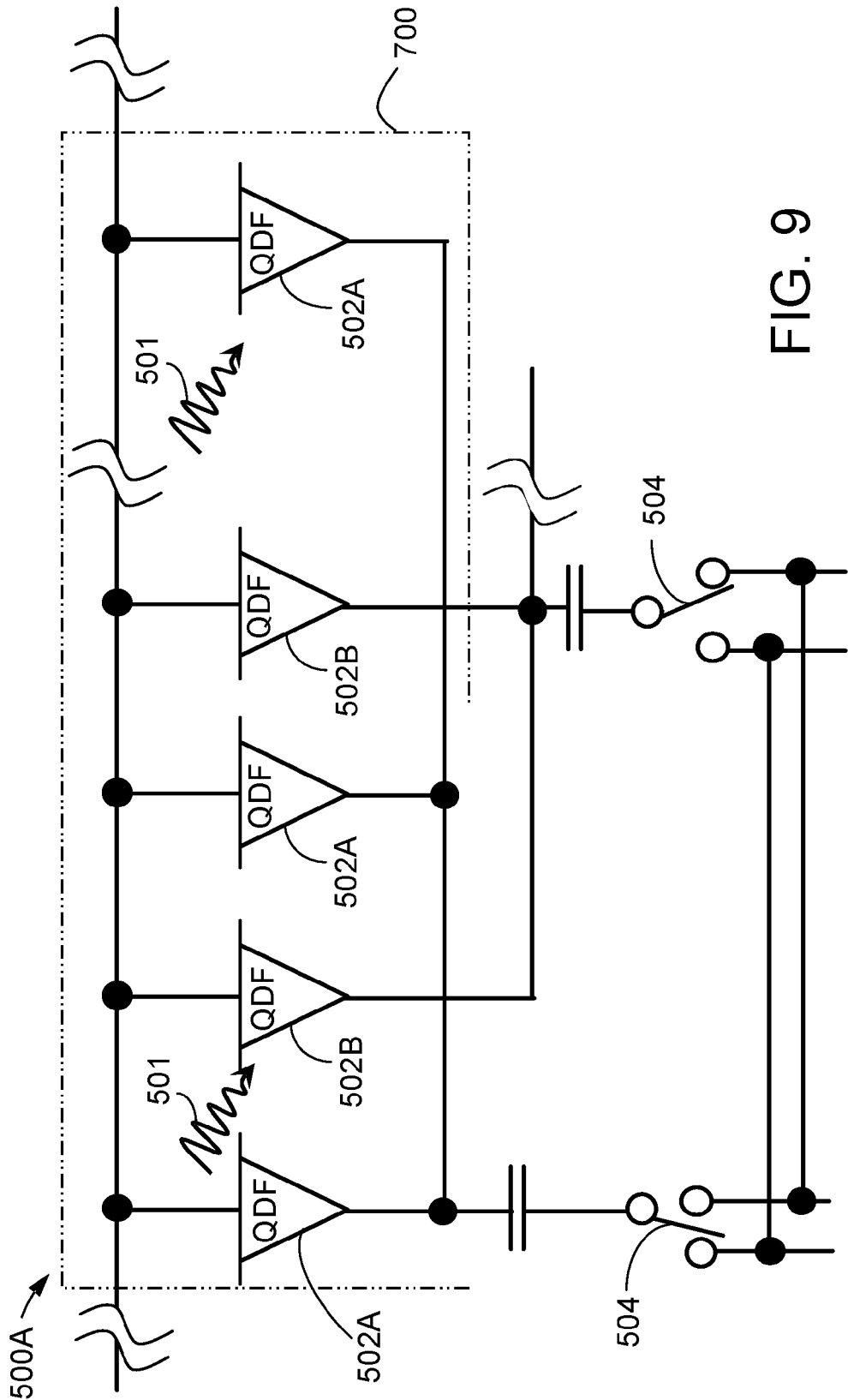
FIG. 9 illustrates an example of a QDF-based demodulation structure including multiple QDF photo detection elements.
Figure 10:
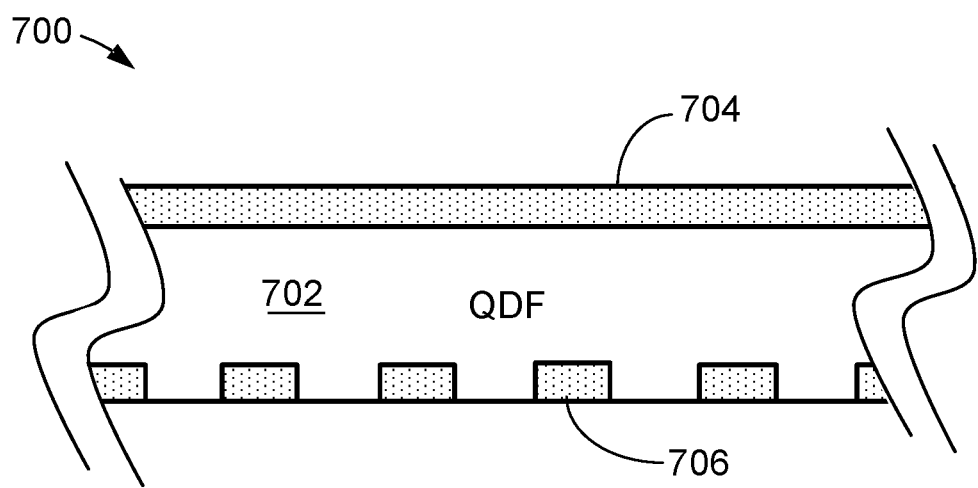
FIG. 10 illustrates a side view of the grid structure for the QDF photo detection elements.

In any of the foregoing examples, each QDF can be implemented as a single QDF photo detection element, or as a grid or array of QDF photo detection elements which allows at least one QDF element to be active at all times during operation. An example is shown in FIG. 9, in which the bottom electrodes of a first group of QDF photo detection elements 502A are coupled together and connected to a first capacitor. The bottom electrodes of a second group of QDF photo detection elements 502B are coupled together and connected to a second capacitor. Modulation signals separated by 180 degrees are applied, respectively, to switches 504 such that each group of QDF photo detection elements is activated about 50% of the time. FIG. 10 illustrates a side view of the grid structure for the QDF.

Figure 11:
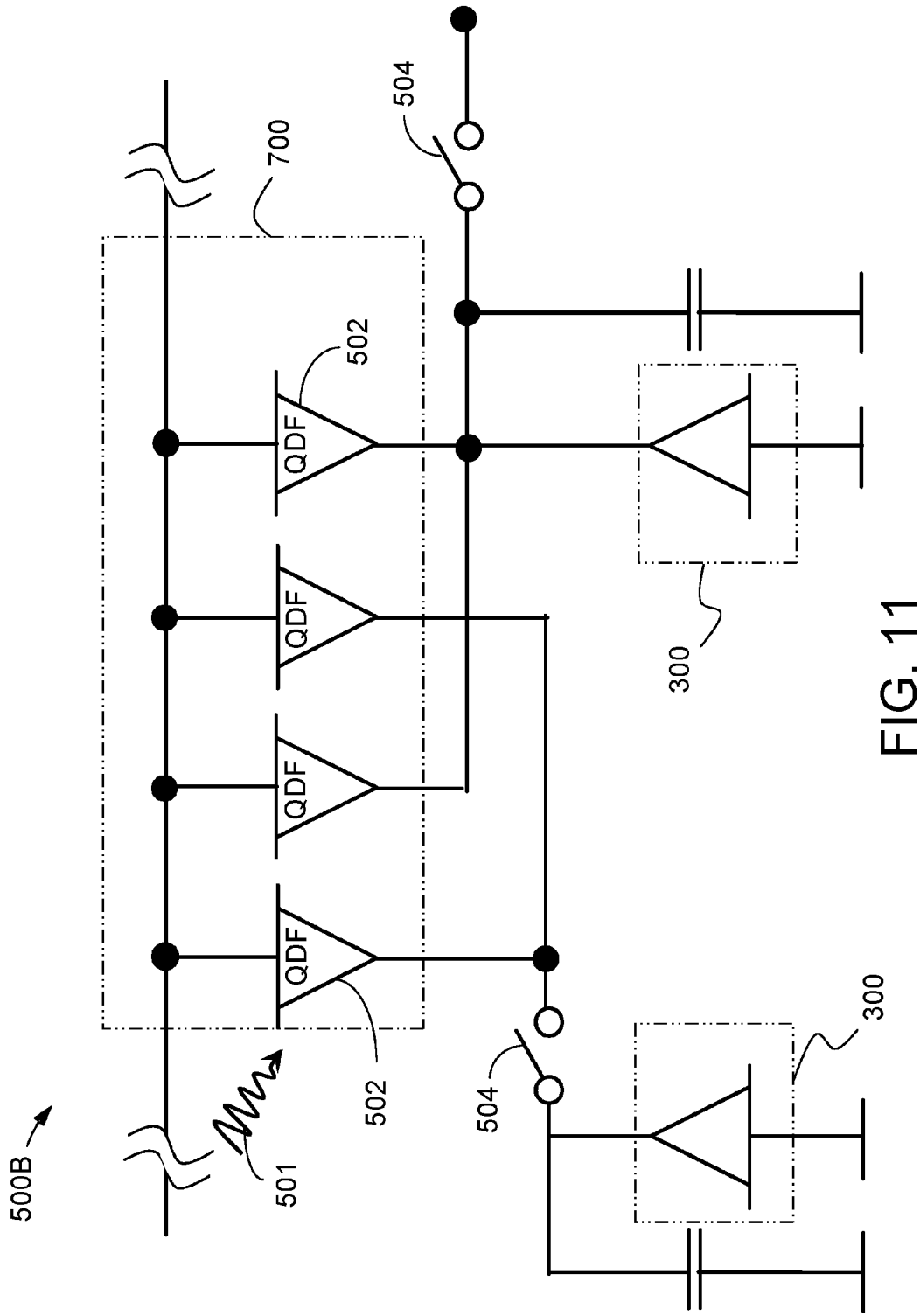
FIG. 11 illustrates another example of a QDF-based demodulation structure including multiple QDF photo detection elements.

FIG. 11 illustrates an example incorporating a grid of QDF photo detection elements 502 each of which is coupled, respectively, to one of two PPDs 300. The bottom electrodes of a first group of QDF photo detection elements are coupled together and connected to a first one of the PPDs 300. The bottom electrodes of a second group of QDF photo detection elements are coupled together and connected to a second one of the PPDs 300. Modulation signals separated by 180 degrees are applied, respectively, to switches 504 such that each group of QDF photo detection elements is activated about 50% of the time.

Figure 12:
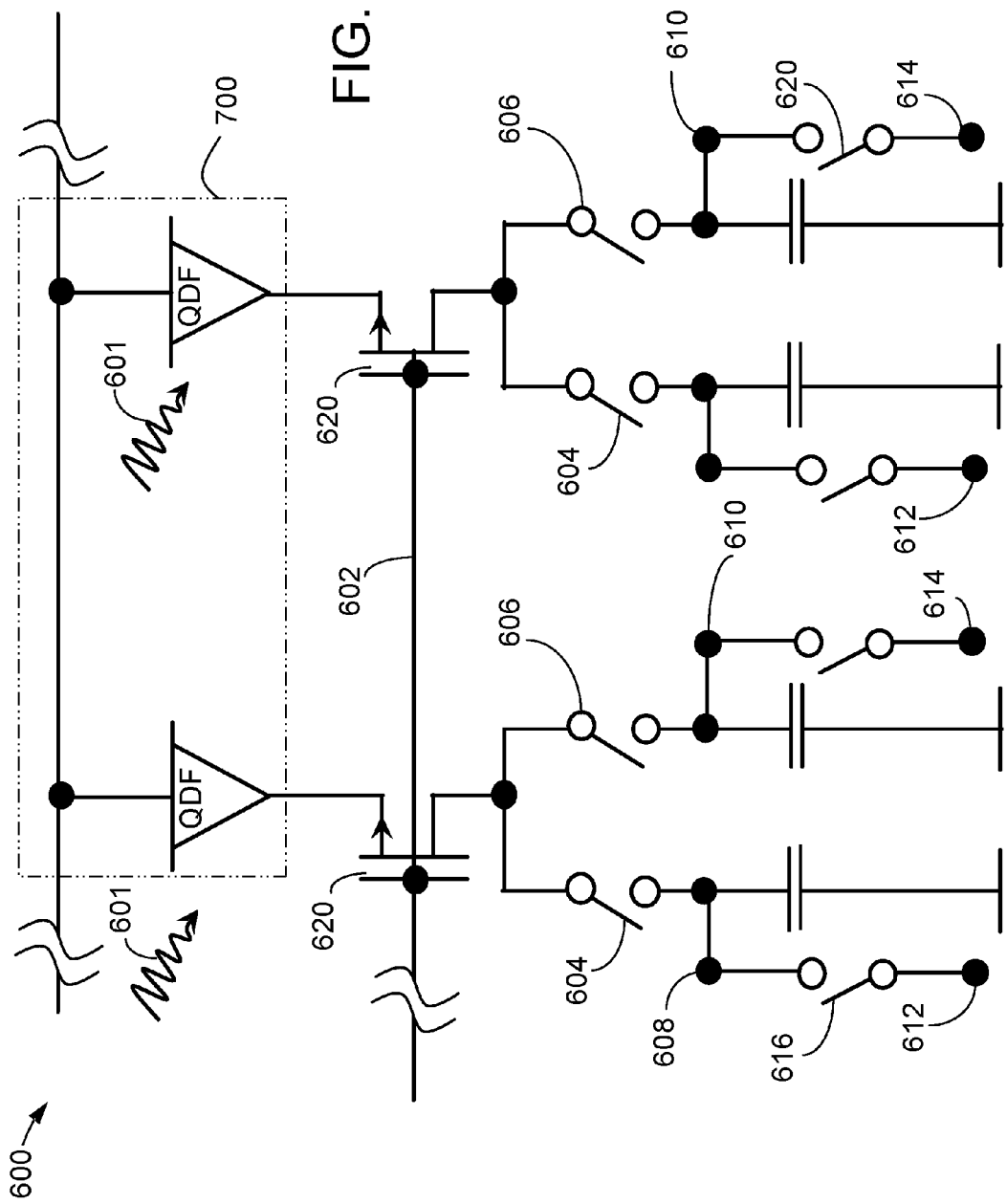
FIG. 12 illustrates a further example of a QDF-based demodulation structure including multiple QDF photo detection elements.

In some implementations, instead of PPDs 300, transistors 620 having their respective gates at the same bias potential as one another can be used, as shown in FIG. 12. Modulation signals separated by 180 degrees are applied, respectively, to switches 504, 506 such that each group of QDF photo detection elements is activated about 50% of the time. When the switches are closed, charge is stored on the storage nodes associated with the capacitors. The circuitry includes reset switches (e.g., 616, 620). Readout circuitry can be coupled to nodes 612, 614.

Figure 13A:
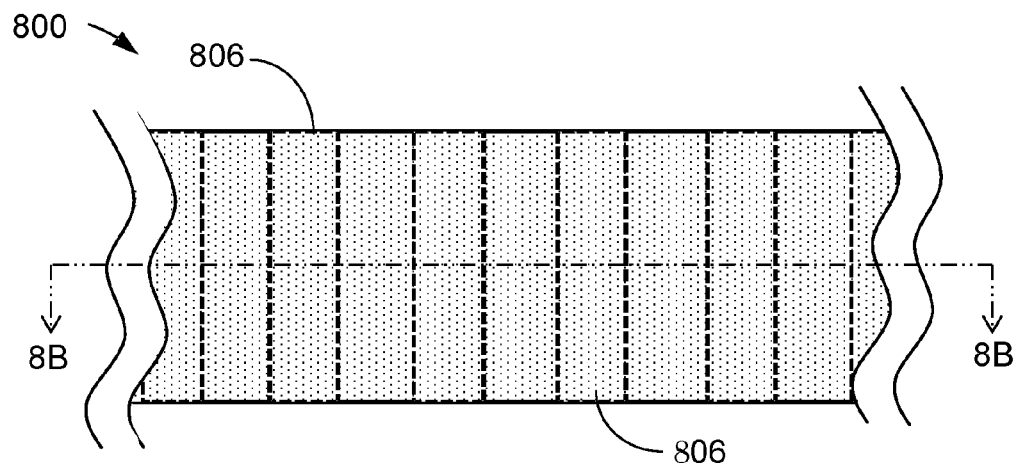
FIGS. 13A and 13B depict, respectively, plane and side views of a grid structure for a QDF.
Figure 13B:
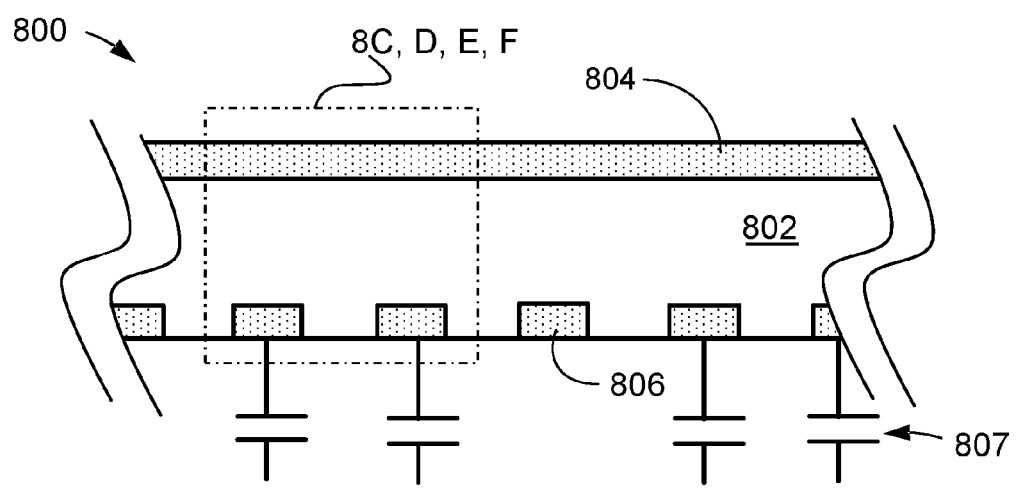

FIGS. 13A and 13B depict, respectively, plane and side views of a grid structure for the QDF. Each of FIGS. 13C, 13D, 13E and 13F depicts a single demodulation pixel that has two taps and can be operated as a two-tap demodulation pixel or as a four-tap demodulation pixel. The latter, however, is a virtual 4-tap pixel; that is, there are physically 2-taps, but it is operated as a 4-tap pixel. This implementation is described in greater detail below. The virtual 4-tap implementation is possible because both electrons and holes contribute to the signal (from the quantum dot film). FIG. 13B shows capacitors 807 attached to the bottom electrodes 806. Other electronic components suitable for collecting charges/converting charges to signals (e.g., charge amplifiers) can be used instead of the capacitors 807.

FIGS. 13C-13F depict the virtual 4-tap demodulation pixel at four instances in time over an integration time (e.g., corresponding to 0°, 90°, 180°, and 270° phase collection) with example voltages applied to the top, bottom left, and bottom right electrodes. Modulated light is incident on the pixel in FIGS. 13C-13F. A timing diagram corresponding to FIGS. 13C-13F is shown in FIG. 13G.

Figure 13C:
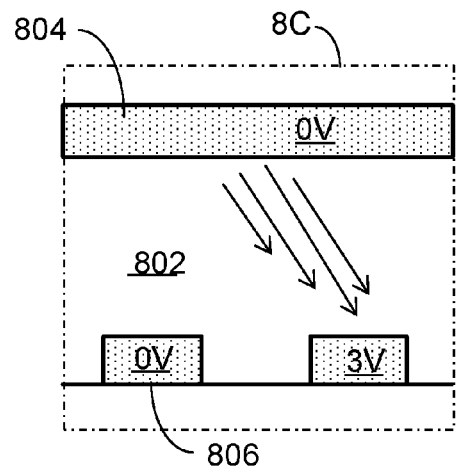
FIGS. 13C, 13D, 13E and 13F depict a demodulation pixel structure operable as a two-tap demodulation pixel or as a four-tap demodulation pixel.

In FIG. 13C, the applied voltages direct electrons to the bottom right electrode where charge accumulates in a corresponding node (e.g., a capacitor or charge amplifier) where the electron charge is associated with the 0° phase.

Figure 13D:
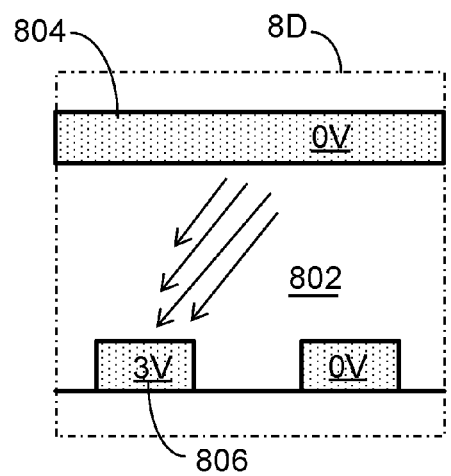

In FIG. 13D, the applied voltages direct electrons to the bottom left electrode where charge accumulates in a corresponding node (e.g., a capacitor or charge amplifier) where the electron charge is associated with the 90° phase.

Figure 13E:
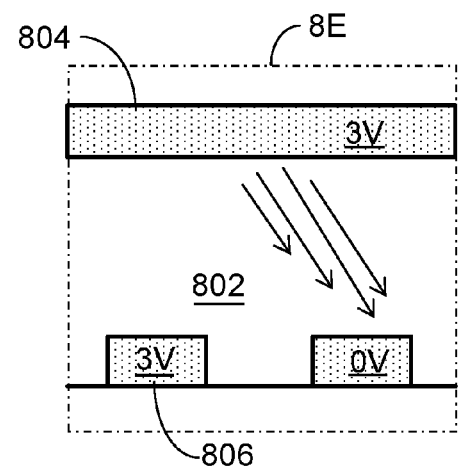

In FIG. 13E, the applied voltages direct holes to the bottom right electrode where charge accumulates in a corresponding node (e.g., a capacitor or charge amplifier) where the hole charge is associated with the 180° phase.

Figure 13F:
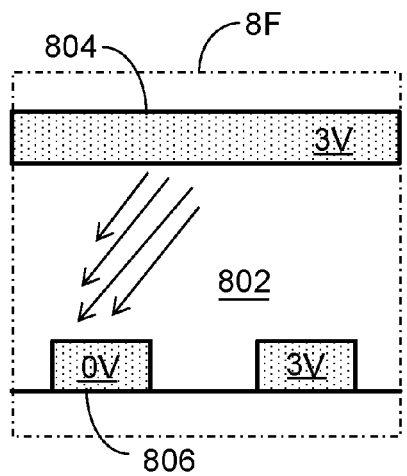
Figure 13G:
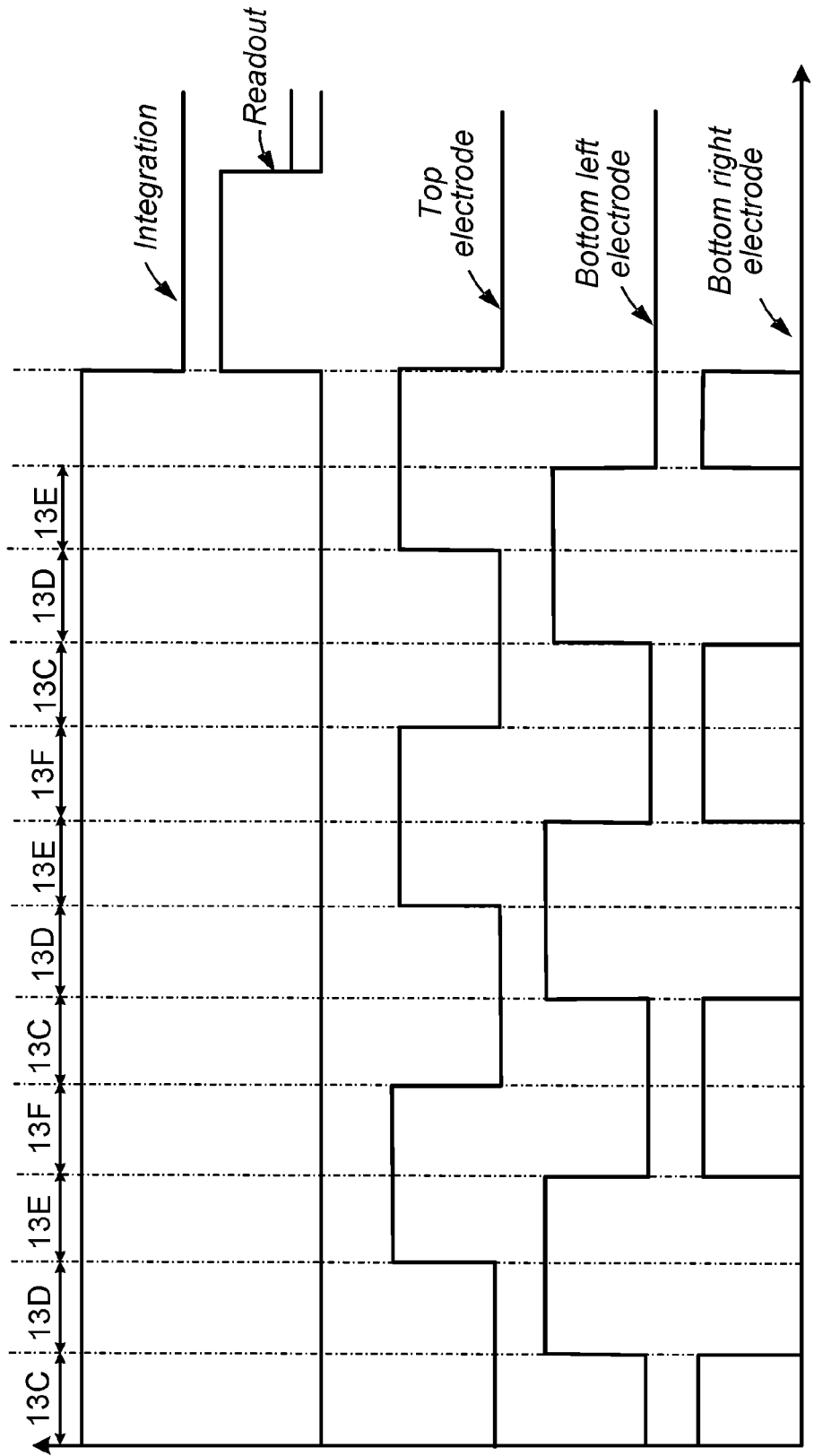
FIG. 13G is a timing diagram associated with FIGS. 13C-13F.

In FIG. 13F, the applied voltages direct holes to the bottom left electrode where charge accumulates in a corresponding node (e.g., a capacitor or charge amplifier) where the hole charge is associated with the 270° phase.

At the end of the integration time, charge (signal) from each node is read out. Since holes have the inverse electric charge of electrons, and since electrons associated with the 0° phase and holes associated with 180° phase are collected at the same node, the two charges effectively cancel each other. The charge that remains (i.e., the signal amplitude ("A")) at that node is equal to 0°-180°. This is the numerator in the TOF equation below:

$$\varphi = \arctan\left(\frac{A0 - A160}{A90 - A270}\right)$$

The foregoing also holds for the 90° and 270° phases. Accordingly, a 2-tap demodulation pixel can be operated as a virtual 4-tap demodulation pixel.

In some implementations (e.g., when the hole mobility and electron mobility are not equal), the QDF demodulation structure can include additional switches and capacitors such that the QDF demodulation structure can be operable to suppress a common mode offset (e.g., background light). Examples of the arrangement of switches and capacitors are described, for example, in US Published Patent Application No. 2010/0308209, which is incorporated herein by reference.

Figure 14A:
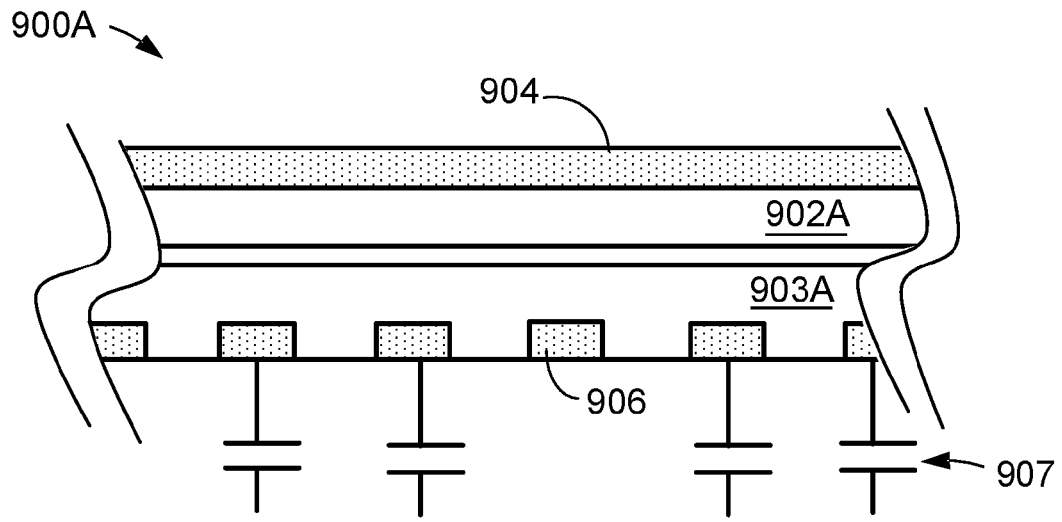
FIGS. 14A and 14B illustrate examples of QDF-based demodulation structures including multiple QDF photo detection elements arranged one over the other.

FIG. 14A depicts a combined quantum dot film and TOF structure. In this example, a first quantum dot film 902A is optimized for a particular wavelength, or range of wavelengths for an application other than TOF (e.g., to collect RGB information of a scene). The quantum dot film 902A is isolated from a second quantum dot film 903A that can be optimized for TOF applications (e.g., for infrared and/or near infrared light). The first quantum dot film 902A need not have its own contacts (i.e., other than the contacts or nodes or electrodes connected to the second quantum dot film 903A). In this example, both functions (e.g., TOF and collection of RGB data) can be performed simultaneously.

Figure 14B:
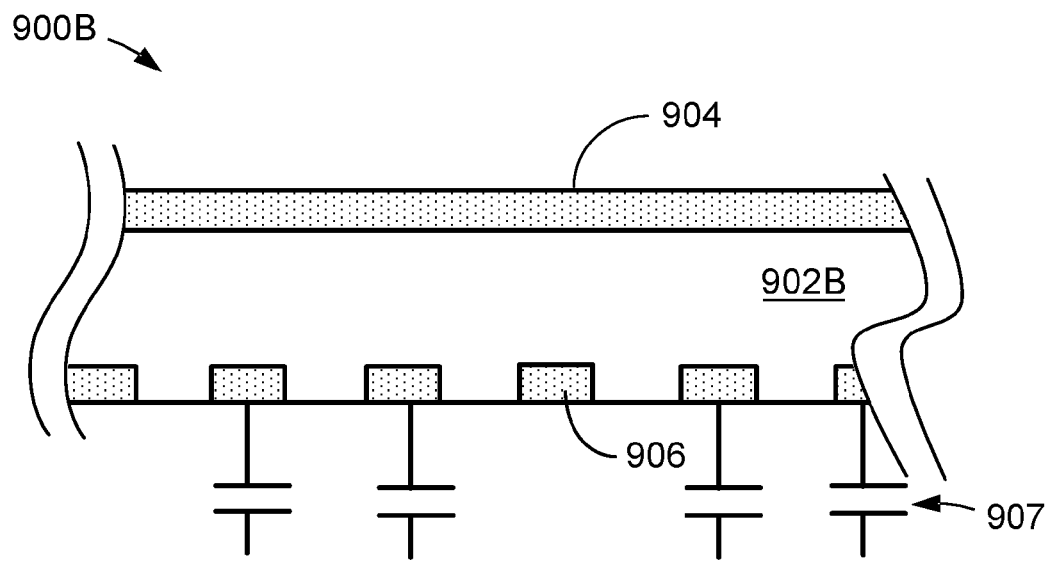

FIG. 14B depicts a single quantum dot film optimized for both TOF and another application (e.g., collection of RGB information of a scene). For example, the quantum dot film 902B can include a multi-modal (e.g., bi-modal) distribution of quantum dot diameters. In this example, one size of quantum dot can be optimized for the collection of light having a first particular wavelength, and a second size quantum dot can be optimized for the collection of light having a second particular wavelength. The first particular wavelength can correspond, for example, to modulated light in the scene and incident on the pixel; accordingly, modulated light can be demodulated and converted into a signal, for example, as described above. After demodulation of the incident light having the first particular wavelength, incident light of a second particular wavelength (or range of wavelengths) can generate a signal. For example, the second particular wavelength can correspond to infrared wavelengths emitted by humans. Accordingly, such a pixel can be used for both TOF (distance measurements) and for passive infrared detection of human subjects.

In some implementations, the quantum dot film includes quantum dots of different composition (e.g., a QDF composed of HgTe and PbSe).

Any of the foregoing TOF pixels and other demodulation structures can be included as part of an optical ranging system that includes an illumination module. In particular, the system can include an array of QDF demodulation structures as described above. The illumination module in such a system is operable to generate modulated light that can be incident on a scene including one or more objects. The illumination module can be implemented, for example, one or more light emitting elements such as light emitting diodes (LEDs), infra-red (IR) LEDs, organic LEDs (OLEDs), infra-red (IR) lasers or vertical cavity surface emitting lasers (VCSELs)). Some of the modulated light directed onto the object(s) can be reflected back to the array of QDF demodulation structures. A comparison of the phase of the light first generated by (emitted from) the illumination module and the phase of the light reflected back from an object to the array of QDF demodulation structures can be used to determine the distance to the object. The comparison and distance determination can be performed, for example, in a microprocessor chip coupled to the read-out circuits for the demodulation and reference pixels.

Various modifications can be made within the spirit of this disclosure and, in some cases, features described in different implementations can be combined in a single implementation. Accordingly, other implementations are within the scope of the claims.

What is claimed is:

1. A device comprising:
a demodulation pixel including:
a quantum dot film (QDF) photo detection element on a semiconductor substrate, wherein the QDF is embedded between first and second electrically conductive contacts and is operable to convert photons to photo-generated charge; and
a charge collection node to store the photo-generated charge.

2. The device of claim 1 including a readout circuit operable to read out the stored photo-generated charge from the charge collection node.

3. The device of claim 2 including a reset switch operable to couple and decouple the read out circuit from the charge collection node.

4. The device of claim 1 wherein a particular one of the contacts is coupled to a capacitor.

5. The device of claim 1 wherein a particular one of the contacts is coupled to a pinned photodiode.

6. The device of claim 5 including a plurality of switches operable, respectively, to couple the particular one of the contacts to a particular one of a plurality of charge collection nodes.

7. The device of claim 5 wherein the pinned photodiode comprises:
a semiconductor substrate;
a first region in the semiconductor substrate having a first-type dopant over a second region having a second-type dopant opposite that of the first-type dopant;
a node in the semiconductor substrate having the second-type dopant and providing direct electrical connection to the particular one of the contacts of the QDF.

8. The device of claim 7 wherein the second region of the pinned photodiode extends laterally, along a first axis, beyond a boundary of the first region and also extends laterally, along a second axis perpendicular to the first axis, beyond the boundary of the first region.

9. The device of claim 8 wherein the node of the pinned photodiode extends laterally, along the second axis, beyond the boundary of the second region.

10. The device of claim 7 wherein the first-type dopant is P type, and the second-type dopant is N type.

11. The device of claim 1 operable to receive a modulated signal at a particular one of the contacts.

12. The device of claim 1 further including a charge amplifier having first and second input terminals, wherein a particular one of the contacts is selectively operable to be coupled to the first or second input terminal, the charge amplifier having first and second output terminals, wherein a first capacitive element for charge storage is coupled between a first one of the input terminals and a first one of the output terminals, and wherein a second capacitive element for charge storage is coupled between a second one of the input terminals and a second one of the output terminals.

13. The device of claim 12 including a first switch and a second switch each of which is operable to receive a respective modulation signal so as to electrically couple the particular one of the contacts to only one of the first or second input terminals at a time.

14. The device of claim 12 further including a second charge amplifier having third and fourth input terminals, wherein the particular one of the contacts is selectively operable to be coupled to the third or fourth input terminal, the charge amplifier having third and fourth output terminals, wherein a third capacitive element for charge storage is coupled between a first one of the input terminals and a first one of the output terminals of the second charge amplifier, and wherein a fourth capacitive element for charge storage is coupled between a second one of the input terminals and a second one of the output terminals of the second charge amplifier.

15. The device of claim 1 wherein the QDF photo detection element comprises a plurality of QDFs.

16. The device of claim 15 wherein the plurality of QDFs include a first group of QDFs and a second group of QDFs, wherein the first and second groups of QDFS are operable to be activated at different times from one another.

17. The device of claim 16 wherein the first group of QDFs is coupled to a first charge storage element and the second group of QDFs is coupled to a second charge storage element.

18. The device of claim 16 wherein the first group of QDFs is coupled to a first pinned photodiode and the second group of QDFs is coupled to a second pinned photodiode.

19. The device of claim 15 wherein a first one of the QDFs is coupled to a first transistor and a second one of the QDFs is coupled to a second transistor, wherein the first and second transistors have their respective gates at a same bias potential as one another.

20. The device of claim 1 wherein the demodulation pixel includes a top electrode and two bottom electrodes, and is selectively operable as a two-tap demodulation pixel or as a four-tap demodulation pixel.

21. The device of claim 1 wherein the QDF includes a multi-modal distribution of quantum dot diameters.

22. The device of claim 21 wherein quantum dots having a first size are optimized for collection of light having a first wavelength, and quantum dots having a second size are optimized for collection of light having a second wavelength.

* * * * *